(12) United States Patent
Shalom et al.

(10) Patent No.: US 6,493,410 B1
(45) Date of Patent: Dec. 10, 2002

(54) WIDE BAND HIGH RESOLUTION SYNTHESIZER

(75) Inventors: Amir Shalom, Kadima (IL); Zohar Kaufman, Rishon Lezion (IL)

(73) Assignee: Shiron Satellite Communications (1996) Ltd., Petah Tikva (IL)

( * ) Notice: Subject to any disclaimer, the term of this patent is extended or adjusted under 35 U.S.C. 154(b) by 0 days.

(21) Appl. No.: 09/443,340

(22) Filed: Nov. 19, 1999

(51) Int. Cl.[7] .................................................. H03D 3/24
(52) U.S. Cl. ...................................... 375/376; 327/113
(58) Field of Search .................. 375/376; 327/113–118; 708/271

(56) References Cited

U.S. PATENT DOCUMENTS

| | | | | | |
|---|---|---|---|---|---|
| 4,952,877 A | * | 8/1990 | Stormont et al. | ............ | 324/307 |
| 5,495,202 A | * | 2/1996 | Hsu | ............................ | 327/113 |
| 5,701,598 A | * | 12/1997 | Atkinson | .................. | 455/161.2 |
| 5,770,977 A | * | 6/1998 | Uurtamo | ..................... | 327/105 |
| 5,801,589 A | * | 9/1998 | Tajima et al. | ................ | 331/1 R |

* cited by examiner

*Primary Examiner*—Don N. Vo
(74) *Attorney, Agent, or Firm*—Mark M. Friedman

(57) ABSTRACT

A frequency synthesizer includes a direct digital synthesizer (DDS), a digital-to-analog converter for converting the output of the DDS to a DDS output signal, a first bandpass filter for filtering the DDS output signal, a single side band mixer for mixing the filtered DDS output signal with a mixing frequency signal, a divider for dividing the mixer output, a second bandpass filter for filtering the mixer output, and a phase lock loop for turning the filtered mixer output into a signal of the desired frequency. This frequency synthesizer combines the high resolution of a DDS with high bandwidth and low noise.

5 Claims, 3 Drawing Sheets

WIDE BAND HIGH RESOLUTION SYNTHESIZER

FIELD AND BACKGROUND OF THE INVENTION

The present invention relates to frequency synthesizers and, more particularly, to a frequency synthesizer having high bandwidth, a low level of spurious frequencies and phase noise, and high resolution. Such a frequency synthesizer would have many applications in electronic communications, for example, for up-conversion and down-conversion.

High resolution variable frequency synthesizers are known. One class of frequency synthesizers is the class of direct digital synthesizers (DDS), for example the model Q2240 DDS available from QUALCOMM Inc. of San Diego Calif. DDSs have variable frequency output at very high resolution, but have relatively high levels of spurious output frequencies. DDSs typically produce frequencies in the MHz range, which is far below frequency bands, such as the L-band (0.950–1.535 GHz) that are of interest for communications. The frequency produced by a DDS may be multiplied, but this also multiplies the spurious frequencies.

FIG. 1A is a block diagram of a circuit recommended by QUALCOMM in their *Synthesizer Products Data Book* for boosting the frequency output by a DDS without a corresponding boost in the spurious frequencies. The output of a DDS 10 is converted to an analog DDS output signal (frequency=$f_{DDS}$) by a digital-to-analog converter 12. The DDS output signal is filtered by a bandpass filter 14 and mixed with a mixing frequency signal, of mixing frequency $f_{MIX} \gg f_{DDS}$, in a mixer 16 to produce a signal that includes the sum and the difference of the frequencies of the two signals input to mixer 16. Mixing frequency $f_{MIX}$ also is called a local oscillator frequency $f_{LO}$. The output of mixer 16 is divided by a divider 18 to reduce the frequency of the mixer output by a factor of P. The resulting divided signal is filtered by a second bandpass filter 20 to produce an output signal with the desired frequency (($f_M + f_{DDS}$)/P or ($f_M - f_{DDS}$)/P). The division by P also reduces the noise (phase noise and spurious frequencies) in the input to mixer 16, so that the output of the circuit of FIG. 1A is much cleaner than the signal that would be obtained simply by multiplying the output of DDS 10.

DDSs have very high resolution but also have limited bandwidth. QUALCOMM recommends the circuit of FIG. 1B for increasing the bandwidth of a DDS. As in the circuit of FIG. 1A, the output of DDS 10 is converted to an analog DDS output signal (frequency=$f_{DDS}$) by digital-to-analog converter 12 and is filtered by a bandpass filter 22. The filtered output is amplified by an amplifier 24. The frequency of the amplified signal is multiplied by a variable factor M in a multiplier 26 and further filtered by a second bandpass filter 28. The circuit of FIG. 1B has a much higher bandwidth than DDS 10, but is noisier than the circuit of FIG. 1A because of the multiplication in multiplier 26.

There is thus a widely recognized need for, and it would be highly advantageous to have, a frequency synthesizer that combines the high resolution of a DDS with high bandwidth and low noise.

SUMMARY OF THE INVENTION

According to the present invention there is provided a wide bandwidth, high resolution, clean frequency synthesizer including: (a) a direct digital synthesizer; (b) a digital-to-analog converter for receiving output from the direct digital synthesizer and producing a DDS output signal; (c) a first bandpass filter for filtering the DDS output signal; (d) a source of a mixing frequency signal; (e) a single side band mixer for mixing the mixing frequency signal with the filtered DDS output signal, thereby producing a mixer output signal; (f) a divider for dividing the mixer output signal, thereby producing a divided signal; and (g) a second bandpass filter for filtering the divided signal.

The present invention includes two innovations. The first innovation is the use of a single side band mixer instead of the mixer of FIG. 1A. The advantage of a single side band mixer is that a single side band mixer outputs either the sum or the difference of the input frequencies, but not both. The second innovation is following bandpass filter 20 with a phase lock loop (PLL). A typical PLL lacks the high resolution of a DDS, but has much cleaner output and a much wider bandwidth than a DDS, and reaches higher frequencies than a DDS.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a frequency synthesizer, based on a DDS, that has high bandwidth, low noise and high resolution.

The principles and operation of a frequency synthesizer according to the present invention may be better understood with reference to the drawings and the accompanying description.

Figure 1A:
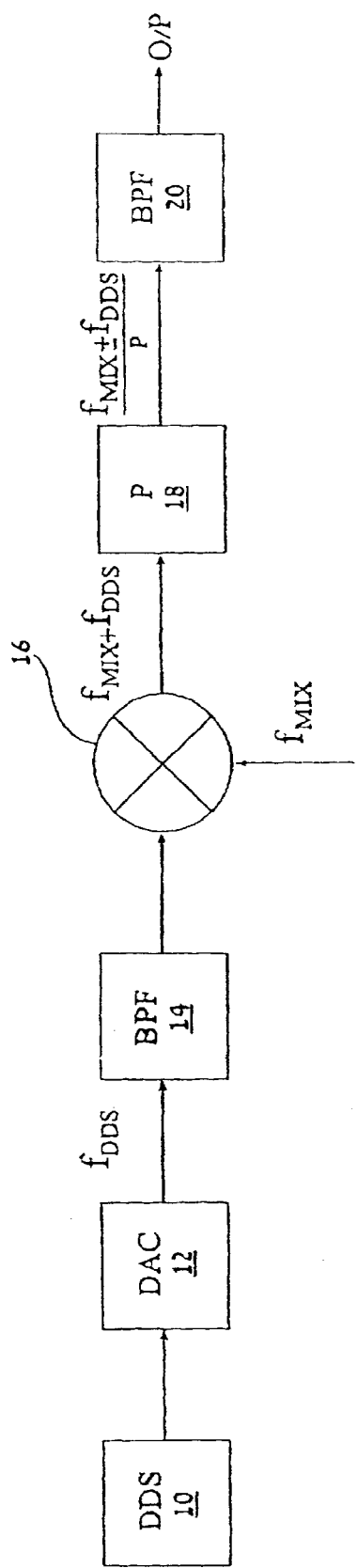
FIG. 1A is a block diagram of a prior art high resolution, low noise circuit for frequency synthesis.
Figure 1B:
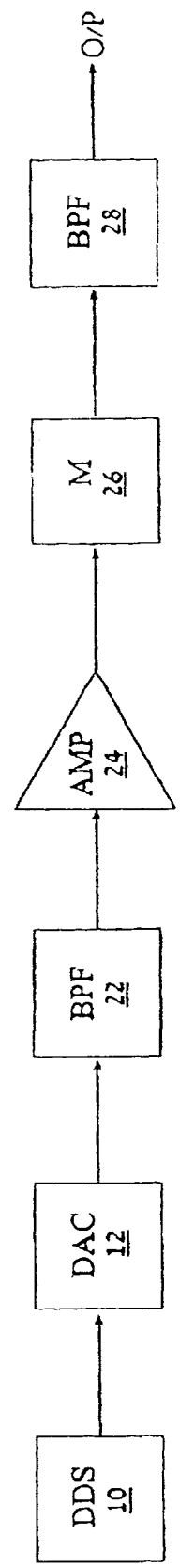
FIG. 1B is a block diagram of a prior art high bandwidth circuit for frequency synthesis.
Figure 2:
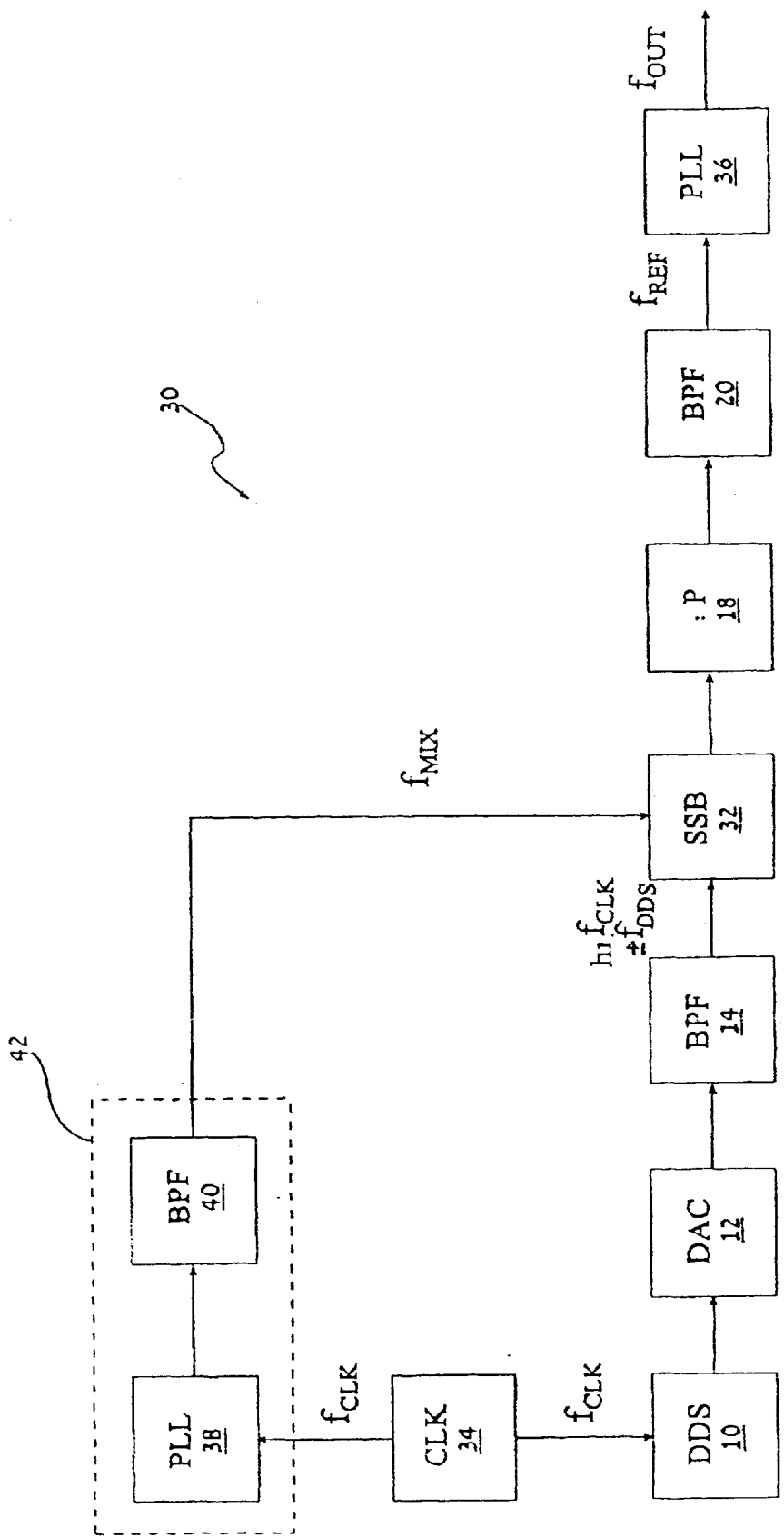
FIG. 2 is a block diagram of a frequency synthesizer according to the present invention.

Referring again to the drawings. FIG. 2 is a block diagram of a frequency synthesizer 30 of the present invention. Frequency synthesizer 30 shares, with the circuit of FIG. 1A: DDS 10, digital-to-analog converter 12, bandpass filter 14, divider 18 and bandpass filter 20. A single side band (SSB) mixer 32 is substituted for mixer 16.

DDS 10 is driven by a system clock 34 that produces a signal having a fixed frequency $f_{CLK}$. DDS 10 synthesizes, in addition to a fundamental output frequency $f_{DDS}$, image frequencies $hf_{CLK} \pm f_{DDS}$, where h is a positive integer. Bandpass filter 14 selects, from the output of digital-to-analog converter 12, a single output frequency, either $hf_{CLK} + f_{DDS}$ or $hf_{CLK} - f_{DDS}$. Clock 34 also drives a source 42 of a mixing frequency $f_{MIX}$. Source 42 includes a PLL 38 and a bandpass filter 40. Although the same clock need not be used to drive both DDS 10 and source 42, it is preferred that both DDS 10 and source 42 be driven by the same clock 34.

Figure 3:
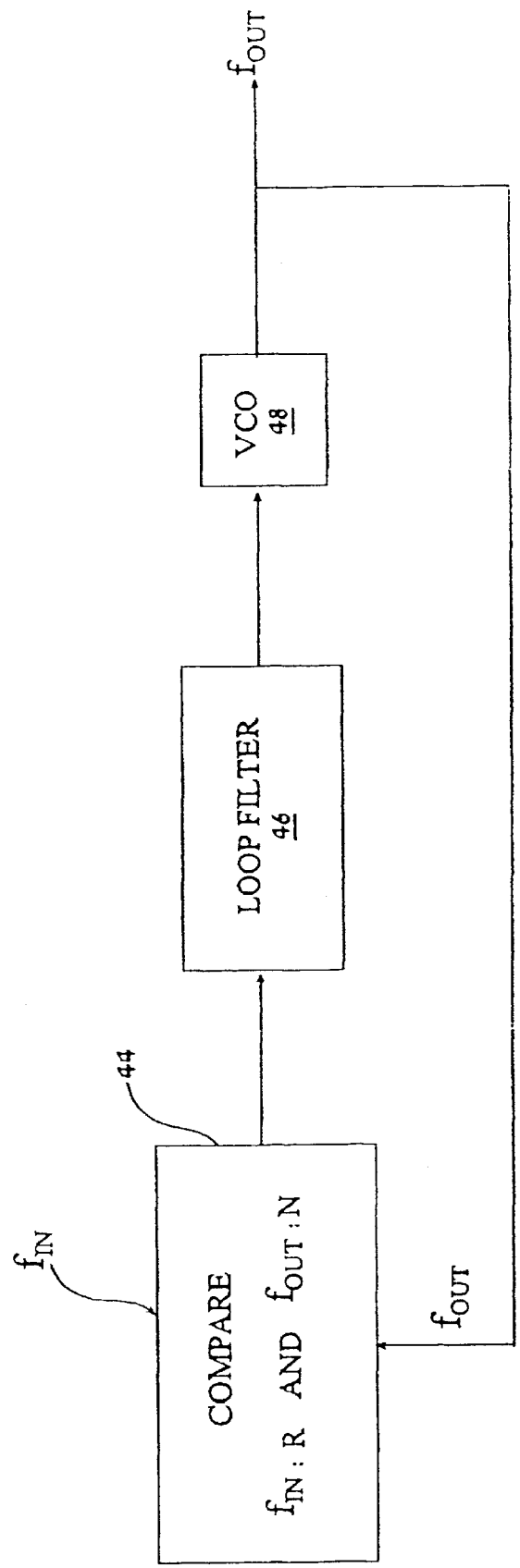
FIG. 3 is a block diagram of a phase lock loop.

FIG. 3 is a block diagram of a PLL. The input signal to the PLL has a frequency $f_{IN}$. A voltage controlled oscillator (VCO) 48 produces a signal of output frequency $f_{OUT}$. In comparator block 44, $f_{IN}/R$ and $f_{OUT}/N$, where R and N are integers that are adjustable parameters of the PLL, are compared to produce an error voltage that is filtered by a loop filter 46 and applied to VCO 48 to keep $f_{OUT}$ equal to $Nf_{IN}/R$. In addition to $f_{OUT}$, the output signal of the PLL typically includes harmonics of $f_{OUT}$.

In source 42, $f_{CLK}$ is the input frequency of PLL 38. Bandpass filter 40 selects, from among the output frequencies of PLL 38, a mixing frequency $f_{MIX}$ that is a harmonic $h_2$ of the fundamental output frequency of PLL 38: $f_{MIX}=h_2Nf_{CLK}/R_1$, where $R_1$ and $N_1$ are the adjustable parameters of PLL 38.

SSB 32 mixes $f_{MIX}$ with the output of bandpass filter 14 to produce a signal whose frequency is $hf_{CLK} \pm f_{DDS} + f_{MIX}$. This frequency is divided by P in divider 18 and is selected by bandpass filter 20 to be the input frequency $f_{REF}$ for PLL 36. The adjustable parameters of PLL 36 are $R_2$ and $N_2$, so that the output of frequency synthesizer 30 is a signal of frequency $f_{OUT}=N_{2(h+hd\ 1f+hd\ CLK\pm f+hd\ DDS+30\ f+hd\ MIX)}/R+hd\ 2P$ Frequency synthesizer 30 has nine adjustable parameters: harmonic factors $h_1$ and $h_2$, parameters $N_1$ and $R_1$ of PLL 38, $f_{DDS}$, the sign of $f_{DDS}$ in the frequency selected by bandpass filter 14, divisor P, and parameters $N_2$ and $R_2$ of PLL 36. Preferably, $f_{DDS}$, $N_2$ and $R_2$ are variable, while $h_1$, $h_2$, $N_1$, $R_1$, P and the sign of $f_{DDS}$ in the frequency selected by bandpass filter 14 are fixed.

The following are typical values of these parameters for synthesizing a frequency $f_{OUT}=1.07$ GHz in the L-band:

$f_{CLK}=10$ MHz $f_{DDS}=3.6$ MHz

Sign Of $f_{DDS}$ in output of bandpass filter 14: negative $N_1=56$ $R_1=5$ $Nf_{CLK}/R_1=112$ MHz $h_1=1$ $h_2=3$ $P=32$ $N_2=1000$ $R_2=10$ $f_{REF}=10.7$ MHz $f_{DDS}$, $N_2$ and $R_2$ are varied to obtain other frequencies in the L-band.

While the invention has been described with respect to a limited number of embodiments, it will be appreciated that many variations, modifications and other applications of the invention may be made.

What is claimed is:

1. A wide bandwidth, high resolution, clean frequency synthesizer comprising:
   (a) a direct digital synthesizer;
   (b) a digital-to-analog converter for receiving output from said direct digital synthesizer and producing a DDS output signal;
   (c) a first bandpass filter for filtering said DDS output signal;
   (d) a source of a mixing frequency signal;
   (e) a single side band mixer for mixing said mixing frequency signal with said filtered DDS output signal, thereby producing a mixer output signal;
   (f) a divider, having a fixed divisor, for dividing said mixer output signal, thereby producing a divided signal;
   (g) a second bandpass filter for filtering said divided signal; and
   (h) a phase lock loop for receiving said filtered divided signal as a reference frequency signal and producing a PLL output frequency signal, said phase lock loop having variable parameters including a divisor of said reference frequency and a divisor of said PLL output frequency.

2. The frequency synthesizer of claim 1, wherein said source of said mixing frequency signal includes:
   (i) a fixed frequency source; and
   (ii) a phase lock loop for receiving said fixed frequency and producing said mixing frequency signal.

3. The frequency synthesizer of claim 2, wherein said source of said mixing frequency signal further includes:
   (iii) a third bandpass filter for filtering said mixing frequency signal.

4. The frequency synthesizer of claim 3, wherein said direct digital synthesizer is driven by said fixed frequency source.

5. The frequency synthesizer of claim 1, wherein said divider receives said mixer output signal directly from said mixer.

\* \* \* \* \*